April 4, 1967 AKIRA ABE 3,311,963

PRODUCTION OF SEMICONDUCTOR ELEMENTS BY THE DIFFUSION PROCESS

Filed May 12, 1964

United States Patent Office 3,311,963
Patented Apr. 4, 1967

3,311,963

PRODUCTION OF SEMICONDUCTOR ELEMENTS BY THE DIFFUSION PROCESS

Akira Abe, Hoya-machi, Kitatama-gun, Tokyo-to, Japan, assignor to Kabushiki Kaisha Hitachi Seisakusho, Chiyoda-ku, Tokyo-to, Japan, a joint-stock company of Japan Filed May 12, 1964, Ser. No. 366,726
Claims priority, application Japan, May 16, 1963, 38/24,313
3 Claims. (Cl. 29—25.3)

This invention relates to techniques in the production of semiconductor elements, and more particularly it relates to a novel method for producing semiconductor devices by the diffusion process.

It is an object of the invention, in its broader aspects, to provide a new, simple, and economical method for producing semiconductor elements having highly desirable electrical characteristics, particularly excellent high-frequency characteristics.

In general, the use of the diffusion process is advantageous in the manufacture of high-frequency transistors. For the semiconductor substrate material of high-frequency transistors, silicon is generally used in many cases because of its desirable properties and facility of its use in the diffusion process. For example, a conventional method of producing semiconductor elements with silicon as the substrate material comprises first covering the surface of an n-type silicon semiconductor substrate with a thin oxidized layer, for example, $SiO_2$, next causing a diffused layer of a p-type impurity (for example, gallium) for constituting the base layer to form throughout said thin oxidized layer, then chemically etching a part of the thin oxidized layer on said diffused layer, and causing an n-type impurity for constituting the emitter layer to diffuse selectively at said part to form an emitter diffused layer.

However, the formation as mentioned above of the thin oxidized layer, if improperly carried out, sometimes has a critically detrimental effect on the selective impurity diffusion to follow. Moreover, the thin oxidized layer has the characteristic of permitting only the gallium constituting the p-type impurity to penetrate therethrough. Because of this permeability, this method in most cases has been limited to the production of elements of the npn type.

As methods of producing diffused type transistors in cases where germanium is used for the semiconductor substrate material, the diffusion and evaporation process, the alloying and diffusion process, and others are known. In the practice of these processes, an impurity to be used as the base layer of the transistor is first caused to diffuse with respect to the germanium base material, and then an emitter layer is formed on said base layer by vacuum evaporation, alloying, or some other process. Consequently, in a semiconductor element obtained in this manner, the emitter pn junction is an alloy junction while the collector pn junction consists of a diffused pn junction. For this reason, the emitter junction capacity is large, and, therefore, it is difficult to produce such semiconductor elements having good frequency characteristics. Such a process, furthermore, has the additional disadvantage of requiring complicated and troublesome process steps such as locally carrying out vacuum evaporation through a fine mask.

For obtaining excellent high-frequency characteristics in a semiconductor element, it is important to cause the collector capacitance $C_c$, the emitter capacitance $C_e$, and the base resistance $r_{bb}$ to be of small magnitudes. However, in attempting to obtain these small magnitudes, certain difficulties are encountered in the aforementioned processes, as will be described more fully hereinafter.

It is a general object of the present invention to eliminate the above-mentioned difficulties and disadvantages associated with conventional methods.

The nature, principle, and details of the invention, as well as other specific objects and advantages thereof, will be more clearly apparent by reference to the following description taken in conjunction with the accompanying drawing in which like parts are designated by like reference characters, and in which:

FIGURES 1(*a*) through 1(*e*) are sectional views, in elevation, showing progressive states of semiconductor elements produced by a preferred embodiment of the method according to the invention;

Figure 4:
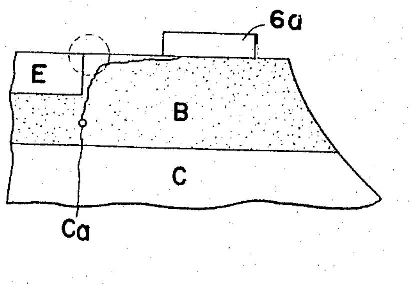
FIGURE 4 is a fragmentary elevational view, in vertical section, showing a part of a known semiconductor element.

In a semiconductor element produced by any of the conventional processes as described hereinbefore, the surface part of the emitter E having high impurity concentration is in contact with the surface part of the base B as shown in FIGURE 4. For this reason, if the surface impurity concentration of the base layer is made high in order to reduce the base resistance $r_{bb}$, the breakdown voltage $V_e$ between the base B and emitter E will be lowered, and, furthermore, the emitter capacitance $C_e$ at this part increases.

The present invention, which has the object of overcoming this difficulty as well as the aforementioned difficulties, contemplates the provision of a new method for producing, in a manner which is substantially simpler than that of conventional methods, semiconductor elements having excellent high-frequency characteristics in which the base width is controlled with high precision, the emitter junction capacitance and the base resistance are low, and the emitter breakdown voltage is high. The specific nature of this method according to the invention will best be understood by reference to the following description with respect to a preferred embodiment presented in sequential order of process.

Figures 1A, 1B, 1C, 1D, 1E:
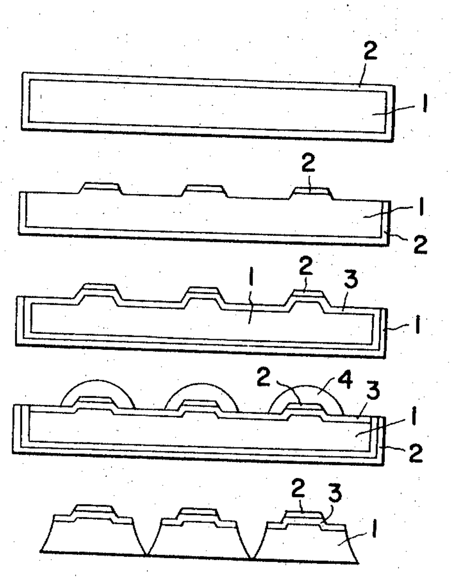

Referring to FIGURE 1, reference character 1 designates a crystal plate consisting of p-type germanium (Ge) having a resistivity of 1 ohm-cm. This plate is first heated in an atmosphere of inert gas, and, while this plate 1 is in this heated state, its surface is caused to be acted upon by a gaseous impurity such as, for example, indium (In), imparting thereto the same conductivity type as that of the Ge crystal plate 1, whereby a layer 2 containing a uniformly deposited p-type diffusion layer is formed on the said surface. The foregoing step constitutes the first diffusion treatment, after which the workpiece appears as shown in FIGURE 1(*a*).

Next, certain parts of the p-type diffusion layer 2 on one surface of the Ge crystal plate 1 are covered with wax, and the other parts are removed by chemical etching, or grooves are formed by mechanical engraving, thereby to expose parts of the Ge crystal plate, whereupon the workpiece assumes the appearance as shown in FIGURE 1(*b*).

Thereafter, the Ge crystal plate is placed in an atmosphere such as, for example, vaporized arsenic (As), containing an impurity having a conductivity of the type opposite to that of the p-type diffusion layer 2 and, moreover, having a diffusion speed (or diffusion constant) which is higher than that of said layer 2. By carrying out the second diffusion treatment on the workpiece as it is so maintained in the above described atmosphere, a new n-type diffusion layer 3 containing As is formed on the exposed surface of the Ge crystal plate and the parts directly below the diffusion layer adjacent to said exposed surfaces, as indicated in FIGURE 1(*c*). In this second diffusion process step, it is of importance to select the surface impurity concentration of the n-type diffusion layer 3 to be amply low so that it will be a small fraction of the surface impurity concentration of the p-type diffusion layer 2.

In order to indicate still more fully the details of the method of local etching of the diffusion layers produced by the first and second diffusion treatment and etching, the following specific example of procedure and result is set forth.

First, indium (In) was caused to diffuse for 23 minutes at a temperature of 850 degrees C. in a p-type germanium crystal plate of 1-ohm-cm. resistivity, and then partial etching was carried out with an etching solution containing hydrofluoric acid (HF) as its principal constituent. Then, the workpiece was subjected to a second diffusion treatment with arsenic (As) for 38 minutes at 750 degrees C. As a result, an indium surface impurity concentration of $10^{19}$ atm./cm.$^3$ and diffusion depth of 1.5 microns and an arsenic surface impurity concentration of $10^{18}$ atm./cm.$^3$ and diffusion depth of 2.5 microns were obtained. That is, there were formed a p-type layer in regions below 2.5 microns from the original surface of the p-type germanium, an n-type layer of 1-micron thickness above said p-type layer, and a p-type layer of 1.5 micron thickness above said n-type layer of 1-micron thickness.

In addition to the above described teachings of the present invention, the invention may be practiced further in the following manner.

For example, simultaneously with the first diffusion process step, or prior or subsequent thereto, an impurity (for example, arsenic) imparting a conductivity type different from that of the principal diffusion impurity (indium in the above described example) may be caused to diffuse (including deposition thereof).

Furthermore, it is possible to use a crystal base material, or substrate, of p type, n type, i type (intrinsic type) or other type. Accordingly, it is possible to produce constructions such as pnp, pnip, npn, and npin.

That is, the essential feature of the present invention resides in its provision of a method comprising:

(1) A process step wherein, in the surface of a semiconductor of p, n, i, or other type, a layer containing an impurity such as to impart one type of electric conductivity (first conductivity type) to said semiconductor is formed;

(2) A process step wherein the layer so formed in the said surface of the semiconductor is partly etched; and (3) A process step wherein, subsequent to the above steps, an impurity such as to impart a conductivity type (second conductivity type) differing from the first conductivity type is caused to diffuse with respect to the said semiconductor.

By the practice of the above process steps, it is possible to form semiconductor layers of said first conductivity type and semiconductor layers of said second conductivity type connected to the semiconductor surfaces below said semiconductor layers of the first conductivity type and to those partly etched as described above.

In the above described manner, the fabrication of the essential parts of the element as a semiconductor element is completed. Next, in order to etch the unwanted parts of this element, the desired parts of the element are first coated with an acid resistive wax 4 as indicated in FIGURE 1(*d*). Then the entire element is immersed in an etching solution such as hydrofluoric acid (HF) to cause etching of the parts other than those directly below the wax coating layer, and the element divisions are separated from each other. The acid resistive wax layer 4 on each element division is then removed by dissolving it in a solvent such as ethylene trichloride, whereupon the elements appear as shown in FIGURE 1(*e*).

Figure 2:
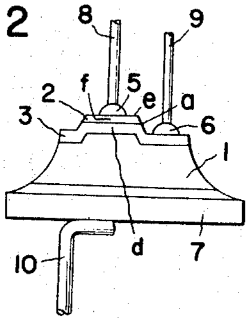
FIG. 2 is an elevational view, in vertical section, showing an example of a semiconductor device produced by the method of the invention.

Each of the semiconductor elements obtained through the above described process is then made to be provided with electrodes 5, 6, and 7 connected as ohmic contacts to respective regions of the element, and lead connectors 8, 9, and 10 are connected respectively to the electrodes 5, 6, and 7 as shown in FIGURE 2. This step of connecting the electrodes and lead wires may be carried out in any manner provided that it is carried out subsequent to the fabrication of the essential parts of the semiconductor element. Thus, the semiconductor element is completed and is operable with a collector region 1, an emitter region 2, and a base region 3.

As is apparent from the foregoing description, the method of the present invention has many advantages. One advantage is that since the emitter junction and the collector junction are both formed by the diffusion process, the base width is controllably made constant. Moreover, the current path from the base electrode 6 to the region *a* below the emitter layer 2 is, in actual effect, only a base layer surface of high impurity concentration. Accordingly, the base width can be made smaller than that in the conventional case wherein, as indicated in FIGURE 4, the current path from the base electrode $\mathbf{6}_a$ to the region $c_a$ below the emitter layer is governed, in actual effect, by the resistance of the part extending from the surface of the base layer of high impurity concentration to the center portion of the base layer of relatively low impurity concentration.

Another advantage is that, because the principal surface part of the emitter layer 2 and the surface of the base layer 3 are not in contact, and, moreover, because the impurity concentration of the emitter side surface *e* decreases, in actual effect, in the second diffusion treatment step, it is possible to increase further the impurity concentration of the exposed surface of the base layer. Accordingly, it is possible to decrease further the base resistance in the current path without lowering the emitter breakdown voltage.

Still another advantage is that, because the impurity concentration of the peripheral part *e* of the emitter layer 2 becomes lower than that at its center part *f*, the injection of minority carriers from the emitter occurs principally in the center part. In addition, in the base layer 3 directly below the emitter layer 2, the concentration gradient is such that the impurity concentration at the peripheral part *a* becomes higher than that at the center part *d*. Consequently, there is no possibility, also in the base layer 3, of the minority carriers spreading to the base layer periphery and dispersing. Therefore, there are afforded advantages such as the possibility of controlling the current amplification factor at a high and constant value, and a semiconductor element having particularly excellent high-frequency characteristics is obtained.

A further advantage of the invention is that, since each of the base, emitter, and collector leads is connected to its respective layer by ohmic contact, the lead connection work is greatly facilitated, it being even possible, for example, by continuous welding in a high-temperature furnace. Thus, complicated and troublesome work such as evaporation deposition resorted to in the production of conventional semi-conductor elements can be omitted, and the formation, beforehand, of oxide films on the semiconductor base material becomes unnecessary. Accordingly, the present invention affords substantial savings in labor and other costs.

Figure 3:
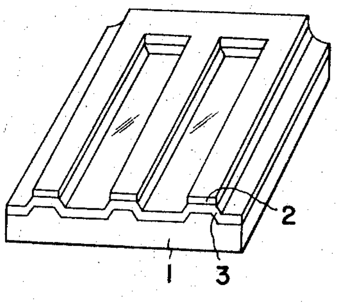
FIGURE 3 is a perspective view, with essential parts in section, showing another example of a semiconductor element formed by the method of the invention.

It is to be observed, further, that the configuration of the base region can be selected from a wide range of choices depending on the etching procedure, whereby it is possible to lower the base resistance. Moreover, by the practice of the present invention, the construction can be adapted for various purposes such as, for example, for high-power use as indicated in FIGURE 3 and, in addition, to various configurations such as those of the single-ring base, multiple-ring base, and the horseshoe base.

The method of this invention is not limited to the production of the above named semiconductor elements but is equally effective in a wide range of other applications such as, for example, the production of pnpn type elements and integrated devices.

Thus, it should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

I claim:

1. A method of producing a pnp germanium transistor comprising the successive steps of (a) diffusing indium into a p-type germanium substrate to form a highly doped p-type diffused layer on the surface of said substrate;

(b) selectively etching said diffused layer to leave a plurality of islands of said p-type diffused layer and to form an exposed surface of said substrate around said islands;

(c) diffusing arsenic through said p-type diffused layer into said substrate and into said exposed surface to form an n-type layer in said substrate beneath said p-type diffused layer and in said exposed surface;

(d) coating said islands and at least one part of said n-type layer formed on said exposed surface with an acid resistive wax, said one part extending from said islands;

(e) immersing the unit thus obtained in an etching solution to etch the uncoated n-type layer and the substrate therebelow and to separate the several element divisions obtained from each other;

(f) removing said wax by means of a solvent; and (g) connecting electrodes to said p-type diffused layer, said n-type diffused layer and said substrate.

2. The method for producing a pnp germanium transistor as defined in claim 1, wherein said indium is caused to diffuse for about 20 minutes at a temperature of about 850° C. and said arsenic is caused to diffuse for about 40 minutes at a temperature of about 750° C.

3. The method for producing a pnp germanium transistor as defined in claim 1, wherein said substrate comprises a p-type germanium crystal plate of about 1 ohm-cm, resistivity, and said indium and arsenic are respectively diffused so that the indium surface impurity concentration of about $10^{19}$ atm./cm.$^3$ and the arsenic surface impurity concentration of about $10^{18}$ atm./cm.$^3$ are obtained.

References Cited by the Examiner

UNITED STATES PATENTS

| | | | |
|---|---|---|---|
| 2,725,315 | 11/1955 | Fuller | 148—191 X |
| 3,022,568 | 2/1962 | Nelson | 148—187 |
| 3,064,167 | 11/1962 | Hoerni | 148—187 X |
| 3,133,840 | 5/1964 | Gibson | 148—189 |
| 3,147,152 | 9/1964 | Mendel. | |
| 3,200,019 | 8/1965 | Scott | 148—187 X |
| 3,210,225 | 10/1965 | Brixey | 148—187 |
| 3,212,943 | 10/1965 | Freck | 148—188 |

HYLAND BIZOT, *Primary Examiner.*